United States Patent [19]

Sumida et al.

[11] 3,950,656

[45] Apr. 13, 1976

[54] STATE DETECTING APPARATUS

[75] Inventors: Shizuo Sumida; Kazuo Nii, both of Hiroshima; Osamu Shimizu, Himeji; Atsushi Ueda, Himeji; Mitsuaki Ishii, Himeji, all of Japan

[73] Assignees: Toyo Kogyo Co., Ltd.; Mitsubishi Denki Kabushiki Kaisha, Tokyo, both of Japan

[22] Filed: Aug. 30, 1974

[21] Appl. No.: 501,962

[30] Foreign Application Priority Data
Aug. 30, 1973 Japan............................. 48-97653

[52] U.S. Cl.............. 307/235 N; 307/251; 307/218
[51] Int. Cl.² ................................................ H03K 5/20
[58] Field of Search............ 307/235 R, 235 N, 218, 307/251; 328/153

[56] References Cited
UNITED STATES PATENTS

| | | |
|---|---|---|
| 3,512,010 | 5/1970 | Washburn...................... 307/235 N |
| 3,555,435 | 1/1971 | Vosteen............................ 328/153 X |
| 3,609,411 | 9/1971 | Ma et al............................ 307/235 N |
| 3,628,070 | 12/1971 | Heuner et al. .................. 307/235 T |
| 3,857,047 | 12/1974 | Knight............................. 307/235 T |

*Primary Examiner*—John S. Heyman
*Attorney, Agent, or Firm*—Oblon, Fisher, Spivak, McClelland & Maier

[57] ABSTRACT

State detecting apparatus comprising: first, second and third terminals, first and second potential detecting circuits each having an input and an output, a resistance, means connecting the inputs of the first and second potential detecting circuits to the first terminal, means connecting the resistance between the first terminal and a power source, means connecting the output of the first potential detecting circuit to the second terminal, means connecting the output of the second potential detecting circuit to the third terminal.

4 Claims, 7 Drawing Figures

STATE DETECTING APPARATUS

BACKGROUND OF THE INVENTION

1. Field of the Invention

The present invention relates to a state detecting apparatus for detecting the state of an electrical device or switch.

2. Description of the Prior Art

In general, a potential detecting circuit is used for detecting the state of a switch or other electrical device. FIG. 1 shows a circuit for detecting the state of a switch. The apparatus of FIG. 1 will be briefly described. In FIG. 1, the reference numeral 1 designates a switch; 2 designates a wire; 3 designates a state detecting circuit; 4 designates a terminal for an electric power source (not shown); 5 designates an input terminal; 6 designates an output terminal; and 8 designates a potential detecting circuit. The wire 2 connects the switch 1 to the state detecting circuit 3. The wire 2 is connected through the resistance 7 to the terminal of electrical power source 4 whereby the potential of the input terminal 5 is kept at the potential of the power source, i.e. "H", in the OFF state of the switch 1. When the switch 1 is in the ON state, the input terminal 5 is grounded and is in the "L" state.

The potential detecting circuit 8 detects the OFF state or ON state of the switch by detecting the change of the switch 1 from the OFF state to the ON state, i.e. by detecting the change of potential of the input terminal 5 from the "H" to the "L" state. The potential detecting circuit 8 detects whether the potential applied to the input terminal 5 is the potential of the power source or the ground potential. The potential detecting level can be in the range of the ground potential to the potential of the power source.

In general, as shown in FIG. 1, the wire 2 for grounding the switch 1 and the state detecting circuit 3 is rather long which can result in a disconnecting fault. When the wire 2 is disconnected and the information concerning the switch 1 is not accurately transmitted to the state detecting circuit 3, the reliability of the control system is quite low even though the reliability of the control device operated by the switch may be quite high.

This problem is particularly acute in a vehicle where many switches are disposed in various positions of the vehicle and some switches are connected to the engines. In this case, the outer environment around the engine is not stable with the result that a wire fault may be easily caused and a detection of the fault is rather difficult.

SUMMARY OF THE INVENTION

It is an object of the present invention to provide a state detecting apparatus which provides accurate information concerning the state of an electrical device or switch.

The foregoing and other objects are attained in accordance with one aspect of the present invention, through the provision of state detecting apparatus comprising: first, second and third terminals, first and second potential detecting circuits each having an input and an output, a resistance, means connecting the inputs of the first and second potential detecting circuits to the first terminal, means connecting the resistance between the first terminal and a power source, means connecting the output of the first potential detecting circuit to the second terminal, means connecting the output of the second potential detecting circuit to the third terminal.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENTS

Figure 1:
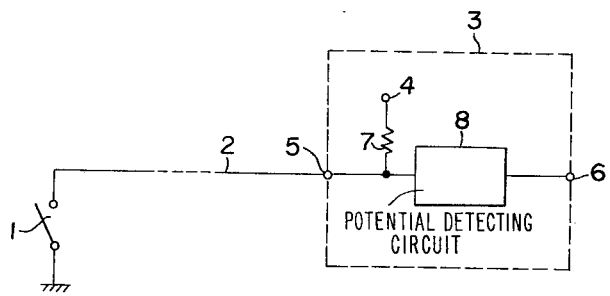
FIG. 1 is a block diagram showing a typical conventional apparatus.
Figure 2:
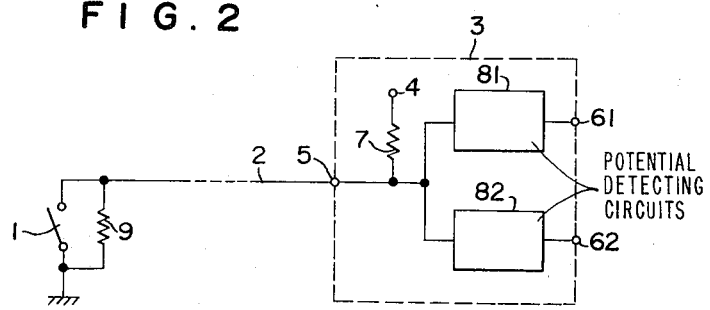
FIG. 2 is a block diagram showing one embodiment of a basic structure according to the invention.

Certain embodiments of the invention will now be described in detail. FIG. 2 is a circuit of one embodiment of the invention. In FIGS. 1 and 2, like reference numerals designate identical or corresponding parts. Reference numerals 81, 82 designate potential detecting circuits which have different potential detecting levels and 61, 62 designate output terminals of the potential detecting circuits 81, 82.

Figure 3:
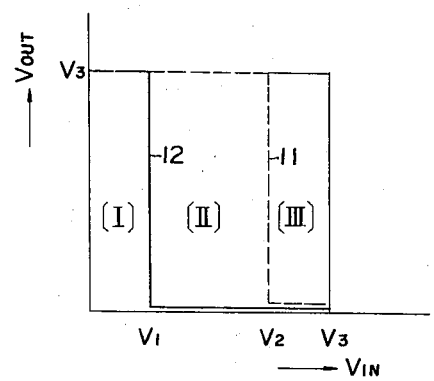
FIG. 3 is a characteristic curve of the apparatus of FIG. 2.

FIG. 3 shows a characteristic curve of the input and output of the potential detecting circuits 81, 82. In FIG. 3, 11 designates a characteristic curve of the potential detecting circuit 81; 12 designates a characteristic curve of the potential detecting circuit 82; $V_1$ designates a potential detecting level of the potential detecting circuit 82; $V_2$ designates a potential detecting level of the potential detecting circuit 81 and $V_3$ designates the potential of the power source.

In FIG. 2, the resistance 9 is connected to both of the terminals of the switch. The resistance 7 has substantially the same value as the resistance 9. When the switch 1 is in the OFF state without a disconnection of the wire 2, the input terminal 5 should be at a potential level equal to half of the potential of the power source. The potential level corresponds to the region II of the characteristic graph of FIG. 3 with the result that the output terminal 61 of the potential detecting circuit 81 is in the "H" state and the output terminal 62 of the potential detecting circuit 82 is in the "L" state. When the switch 1 is turned on without disconnection of the wire 2, the input terminal 5 is grounded, which corresponds to the region I of the characteristic graph of FIG. 3. Accordingly, the output terminals 61, 62 of the potential detecting circuits 81, 82 are in the "H" state.

If the wire 2 is disconnected, the input terminal 5 remains connected through the resistance 7 to the terminal of the power source whereby the potential of the power source is applied to terminal 5 which corresponds to the region III of the characteristic graph of FIG. 3. Accordingly, the output terminals 61, 62 of the potential detecting circuit 81, 82 are in the "L" state.

The turn-on and turn-off of the switch 1 and the disconnection of the wire 2 can be detected by the combination of output signals of the output terminals 61, 62 of the potential detecting circuits 81, 82.

Figure 4:
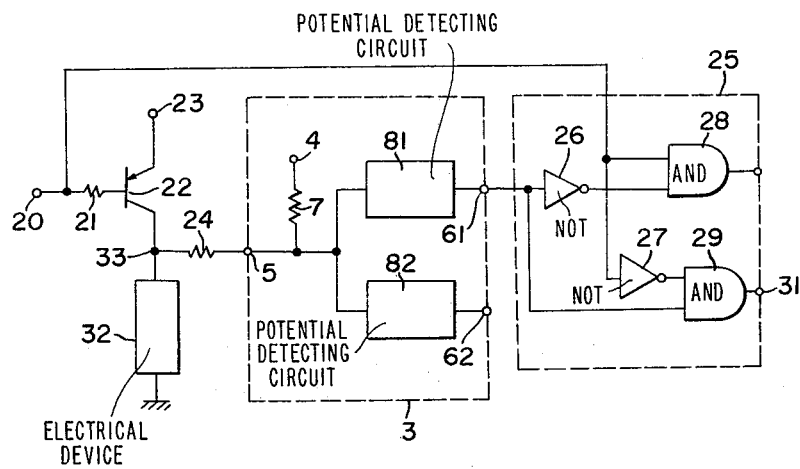
FIG. 4 is a block diagram showing one embodiment of the invention.

It has been stated that it is possible to detect the state of the switch 1 by the state detecting circuit 3. It is also possible to detect a disconnection or a short-circuit of an electrical device using the state detecting circuit 3 of FIG. 2. FIG. 4 shows another embodiment of the invention and illustrates a circuit for detecting the disconnection or short-circuit of an electrical device using the state detecting circuit of FIG. 2. In FIG. 4, the reference numeral 20 designates an input terminal for a driving signal; 21 designates a resistance; 22 designates a driving transistor; 23 designates a terminal of a power source (not shown); 24 designates a resistance; 25 designates a fault signal generating circuit; 26, 27 designate NOT circuits; 28, 29 designate AND circuits; 30, 31 designate output terminals and 32 designates electrical device.

The operation of the apparatus of FIG. 4 will now be described. In FIG. 4, a driving signal for driving the electrical device 32 is applied to the input terminal 20. When the driving signal is in the "L" state, the driving transistor 22 is turned on and the electrical device 32 is driven. The potential at the contact 33 between the driving transistor 22 and the electrical device 32 is substantially the same as the potential of the power source.

When the driving signal is in the "H" state, the driving transistor 22 is turned off and the electrical device 32 is not driven. The potential at the contact 33 will be substantially zero. This is because the input terminal 5 of the state detecting circuit 3 is connected through the resistance 24 to the contact 33. The resistance 7 is substantially equal in value to the resistance 24 and the sum of the two is much greater than the resistance of the electrical device 32. Accordingly, the resistance of the electrical device 32 can be neglected in comparison with the value of the resistances 7, 24. When the electrical device 32 is not driven and there is no fault with the electrical device, the contact 33 will be at ground potential with the result that a potential equal to half of the potential of the power source is applied to the input terminal 5. This is the state of the region II of the characteristic graph of FIG. 3 with the output terminal 61 of the potential detecting circuit 81 in the "H" state and the output terminal 62 of the potential detecting circuit 82 in the "L" state.

If the electrical device 32 is disconnected, the passage of current through the resistances 7, 24 and the electrical device 32 is interrupted and the potential of the power source is applied to the input terminal 5. This is the state of the region III of the characteristic graph of FIG. 3, the output terminals 61, 62 of the potential detecting circuits 81, 82 being in the "L" state.

If the electrical device 32 is disconnected, the signal of the output terminal 61 is changed from the "H" state to the "L" state. When the electrical device 32 is disconnected, the potential of the contact 33 is substantially equal to the potential of the power source with the result that the potential of the power source is applied to the input terminal 5. This is the state of the region III of the characteristic graph of FIG. 3, the output terminals 61, 62 of the potential detecting circuits 81, 82 being in the "L" state.

If the electrical device 32 is short-circuited, contact 33 is grounded. Accordingly, the power source voltage is divided in half by the resistances 7, 24 and is applied to the input terminal 5. This is the state of the region II of the characteristic graph of FIG. 3. Accordingly, the signal of the output terminal 61 of the potential detecting circuit 81 is in the "H" state. The signal of the output terminal 62 of the potential detecting circuit 82 is in the "L" state. The change of signal of the output terminal 61 from the "L" state to the "H" state is detected as a short-circuit of the electrical device 32.

The output terminal 61 of the potential detecting circuit 81 is connected to the fault signal generating circuit 25. The signal of the potential detecting circuit 81 is divided by the fault signal generating circuit 25 to generate a disconnection signal and a short-circuit signal depending upon the malfunction.

The AND circuit 28 generates a disconnection signal for indicating a disconnection fault; the signal of the output terminal 30 being in the "H" state when the driving signal is in "H" state with the electrical device 32 not being driven; and the signal of the output terminal 61 of the potential detecting circuit 81 being in the "L" state by the disconnection of the electrical device 32. The AND circuit 29 generates a short-circuit signal for indicating a short-circuit fault; the signal of the output terminal 31 being in the "H" state when the driving signal is in the "L" state with the electrical device 32 being driven; and the signal of the output terminal 61 of the potential detecting circuit 81 being in the "H" state by the short-circuit of the electrical device 32. Thus, the fault signal generating circuit 25 utilizes the signal of the state detecting circuit 3 to generate the disconnection signal and the short-circuit signal.

Thus, the potential detecting circuit 81 detects the disconnection of the wire 2 of FIG. 2 or the fault of the electrical device 32 of FIG. 4. The potential detecting circuit 82 detects the turn-on or turn-off of the switch 1. Thus, the potential detecting circuits 81, 82 detect both states. Accordingly, the states of both the switch 1 and the electrical device 32 can be detected by the same state detecting circuit 3.

Figure 5:
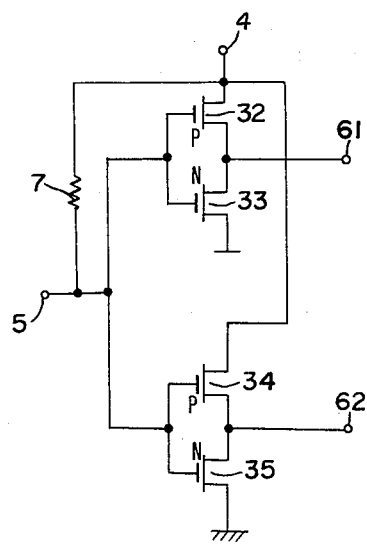
FIGS. 5 and 6 are respectively diagrams of circuits according to the invention.
Figure 6:
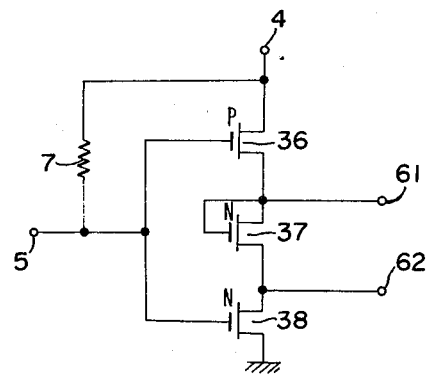

As stated above, the potential detecting circuit with two different potential detecting levels can be a Schmitt circuit having different potential detecting levels or a comparator having different reference voltages. As shown in FIGS. 5 and 6, the circuit can be simplified by utilizing the threshold voltage of a metal oxide semiconductor FET (MOS FET). The potential detecting circuit using the metal oxide semiconductor FET is suitable for an integrated circuit.

In FIG. 5, 32, 34 each designate a P channel metal oxide semiconductor FET and 33, 35 each designate an N channel metal oxide semiconductor FET. The mutual conductances of 32, 33, 34, 35 designated gm 32, gm 33, gm 34, gm 35 have the following relationships $$\text{gm } 32 >> \text{gm } 33$$

$$\text{gm } 34 << \text{gm } 35$$

The N channel metal oxide semiconductor FET 33 is a load resistance of the P channel metal oxide semiconductor FET 32 and can be replaced by a resistance. The P channel metal oxide semiconductor FET 34 is a load resistance of the N channel metal oxide semiconductor FET 35 and can be replaced by a resistance.

The detecting levels $V_1$, $V_2$ of the characteristic graph of FIG. 3 can be determined by the threshold voltage of the N channel metal oxide semiconductor FET 35 and the P channel metal oxide semiconductor FET 32. Accordingly, the detecting levels $V_1$, $V_2$ can be easily selected by changing the threshold voltage of the metal oxide semiconductor FETs.

In FIG. 6, 36 designates a P channel metal oxide semiconductor FET and 37, 38 designate N channel metal oxide semiconductor FETs. The mutual conductances of the metal oxide semiconductor FETs 36, 37, 38 are designated gm 36, gm 37, gm 38 and have the following relationships $$gm\ 36 \sim gm\ 38 >> gm\ 37.$$

The N channel metal oxide semiconductor 37 is a load resistance and can be replaced by a resistance. In FIG. 6, the detecting levels $V_1$, $V_2$ of the characteristic graph of FIG. 3 can be determined by the threshold voltages of the N channel metal oxide semiconductor FET 38 and the P channel metal oxide semiconductor FET 36.

As stated above, the states of the switch and the electrical device can be detected. When the apparatus of the invention is used in a control system wherein a plurality of electrical devices are controlled by a plurality of switches, a fault of the electrical device can be easily indicated and the faulty electrical device can be easily detected by switching.

Figure 7:
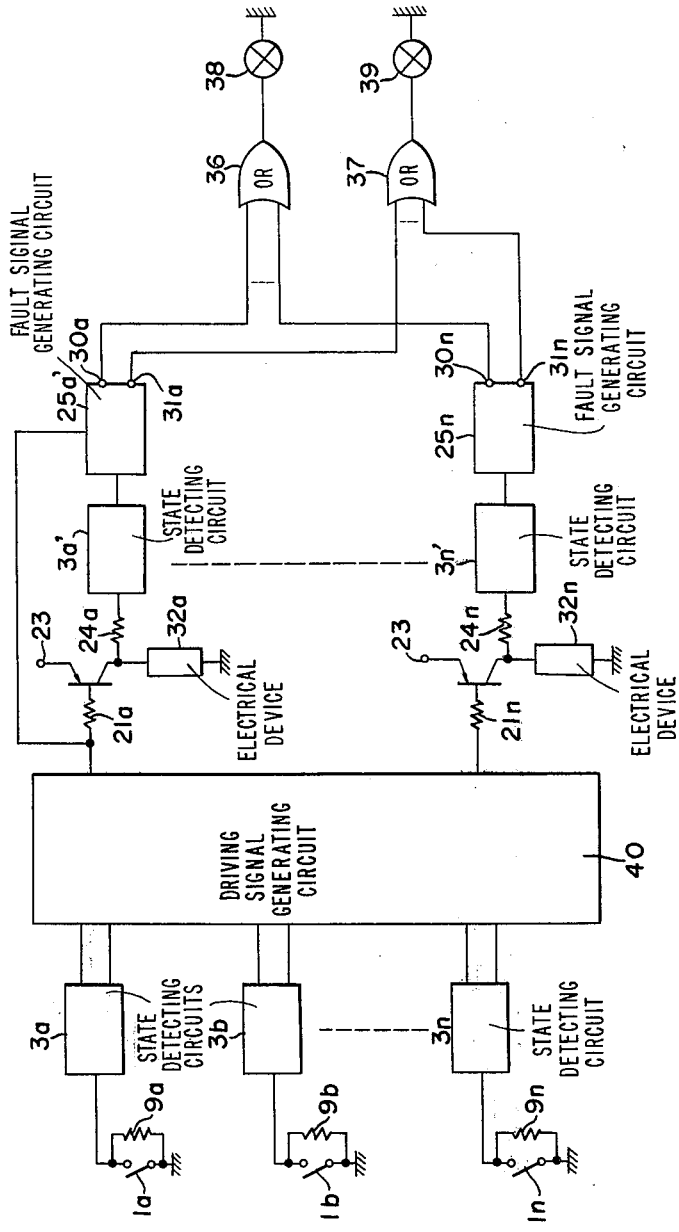
FIG. 7 is a block diagram showing another embodiment of the invention.

FIG. 7 is another embodiment for detecting a fault of an electrical device by switching. In FIG. 7, $1a - 1n$ designate switches; $3a - 3n$ and $3a' - 3n'$ designate state detecting circuits having the same structure as that of the state detecting circuits of FIG. 4; $9a - 9n$, $21a - 21n$ and $24a - 24n$ designate resistances; 23 designates a terminal of a power source; $25a - 25n$ designate fault signal generating circuits having the same structure as that of the fault signal generating circuit 25 of FIG. 4; $30a - 30n$ and $31a - 31n$ designate terminals which generate output signals the same as the output signals of the output terminals 30, 31 of FIG. 4; 36, 37 designate OR circuits; 38 designates a disconnection indicating lamp; 39 designates a short-circuit indicating lamp and 40 designates a driving signal generating circuit.

The apparatus of FIG. 7 will now be described. The state detecting circuits $3a - 3n$ detect the states of the switches $1a - 1n$. The driving signal generating circuit 40 generates driving signals to the electrical devices $32a - 32n$ corresponding to the switches $1a - 1n$ depending upon the states of the switches $1a - 1n$ detected by the state detecting circuits $3a - 3n$. The state detecting circuits $3a - 3n$ detect the electrical devices $32a - 32n$ as in the case of FIG. 4. The fault signal generating circuits $25a - 25n$ detect the signals of the state detecting circuits $3a - 3n$ whereby the disconnection signal and the short-circuit signal are generated.

The output terminals $30a - 30n$ are connected to the input terminals of the OR circuit 36 whereby the disconnection indicating lamp 38 is turned on when at least one electrical device is disconnected. The output terminals $31a - 31n$ are connected to the input terminals of the OR circuit 37 whereby the short-circuit indicating lamp is turned on when at least one electrical device is short-circuited.

The disconnection signal is generated only when the electrical devices $32a - 32n$ are not being driven, i.e., switches $1a - 1n$ are in the OFF state. Accordingly, when the disconnection indicating lamp 38 is turned on, the switches $1a - 1n$ are sequentially turned on and off with the result that the disconnection indicating lamp 38 is turned on and off depending upon the turn-on and turn-off operation of the switch. The disconnection of the electrical device corresponding to the switch can therefore be detected.

The short-circuit signal is generated only when the electrical devices $32a - 32n$ are being driven, i.e. switches $1a - 1n$ are in the ON state. Accordingly, when the short-circuit indicating lamp 39 is turned on, the switches $1a - 1n$ are sequentially turned on and off with the result that the short-circuit indicating lamp is turned on and off depending upon the turn-on and turn-off operation of the switch. The state of the short-circuit of the electrical device corresponding to the switch can therefore be detected.

In accordance with the embodiment, it is unnecessary to indicate all of the output signals of the fault signal generating circuits $25a - 25n$ separately and it is possible to indicate the fault by a small number of indicating lamps. The fault of the electrical device can be easily attained by switching the state of the switches. When the disconnection fault and the short-circuit fault are indicated by only one indicating lamp, it is possible to detect the faulty electrical device by turning the switches sequentially on and off.

As stated above, in accordance with the invention, the state detecting circuit is formed with the potential detecting circuit having two different potential detecting levels and the state detecting circuit having a plurality of resistances, whereby the state of switches, the disconnection of wiring to switches, the disconnection of electrical devices or the short-circuiting of electrical devices can be detected by using the same state detecting circuits. Accordingly, wire disconnections and electrical device faults can be easily detected whereby the reliability of the control apparatus can be highly improved.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the U.S. is:

1. State detecting apparatus for detecting whether a switch is in its opened or closed state and for detecting whether a lead connected between the switch and a potential detecting circuit is faulty comprising:

a power source for supplying potential,
a first resistance,
a potential detecting circuit,
a switch having an opened and a closed state,
a second resistance,
a ground,
means connecting the switch and the second resistance in parallel,
means connecting one terminal of the switch-second resistance parallel combination to the ground,
a lead connecting the other terminal of the switch-second resistance parallel combination to a first terminal of the first resistance,
means connecting the other terminal of the first resistance to the power source,
means connecting the potential detecting circuit to the first terminal of the first resistance,
the first resistance being equal in value to the second resistance, the potential detecting circuit indicating both a non-fault condition of the lead and the switch in its opened state when the potential detected is equal to half the power source potential, the potential detecting circuit indicating both a non-fault condition of the lead and the switch in its closed state when the potential detected is equal to ground potential, the potential detecting circuit indicating a fault condition of the lead when the potential detected is equal to the power source potential.

2. State detecting apparatus comprising:

first, second and third terminals, first and second potential detecting circuit each having an input and an output, a resistance, means connecting the inputs of the first and second potential detecting circuits to the first terminal, means connecting the resistance between the first terminal and a power source, means connecting the output of the first potential detecting circuit to the second terminal, means connecting the output of the second potential detecting circuit to the third terminal, a second resistance, an electrical device, a switch, a source of input signals, means connecting the electrical device to the first terminal through the second resistance, means connecting the junction between the second resistance and the electrical device to the switch, means connecting the switch to a source of input signals, a first NOT gate, a second NOT gate, a first AND gate, a second AND gate, means connecting the second terminal to the input of the first NOT gate and to the second input of the second AND gate, means connecting the output of the first NOT gate to the second input of the first AND gate, means connecting the source of input signals to the first input of the first AND gate and to the input of the second NOT gate, means connecting the output of the second NOT gate to the first input of the second AND gate whereby an open circuit or a short circuit in the electrical device may be detected.

3. State detecting apparatus in accordance with claim 2 wherein the first potential detecting circuit comprises a P channel MOS FET connected to an N channel MOS FET wherein the conductance of the P channel MOS FET is much greater than the conductance of the N channel MOS FET and wherein the second potential detecting circuit comprises a P channel MOS FET connected to an N channel MOS FET wherein the conductance of the P channel MOS FET is much less than the conductance of the N channel MOS FET.

4. State detecting apparatus in accordance with claim 2 wherein the first potential detecting circuit comprises a P channel MOS FET connected to a first N channel MOS FET and wherein the second potential detecting circuit comprises a second N channel MOS FET wherein the conductance of the P channel MOS FET is roughly equal to the conductance of the second channel MOS FET which is much greater than the conductance of the first N channel MOS FET.

* * * * *